United States Patent
Iga et al.

(10) Patent No.: US 7,701,993 B2
(45) Date of Patent: Apr. 20, 2010

(54) SEMICONDUCTOR OPTICAL DEVICE AND A METHOD OF FABRICATING THE SAME

(75) Inventors: Ryuzo Iga, Atsugi (JP); Yasuhiro Kondo, Atsugi (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 356 days.

(21) Appl. No.: 10/577,626

(22) PCT Filed: May 26, 2005

(86) PCT No.: PCT/JP2005/009656

§ 371 (c)(1),
(2), (4) Date: Apr. 28, 2006

(87) PCT Pub. No.: WO2005/117217

PCT Pub. Date: Dec. 8, 2005

(65) Prior Publication Data

US 2008/0137703 A1    Jun. 12, 2008

(30) Foreign Application Priority Data

May 26, 2004 (JP) ............................. 2004-155785

(51) Int. Cl.
*H01S 5/00* (2006.01)
*H01L 21/00* (2006.01)
(52) U.S. Cl. .................... 372/46.01; 372/45.01; 438/39
(58) Field of Classification Search .............. 372/45.01, 372/46.01; 438/39
See application file for complete search history.

(56) References Cited

U.S. PATENT DOCUMENTS 5,470,785 A    11/1995    Kondo
(Continued)

FOREIGN PATENT DOCUMENTS

JP    61-180493    8/1986
(Continued)

OTHER PUBLICATIONS

A. Dadgar et al., *Ruthenium: A Superior Compensator of InP*, Applied Physics Letters, vol. 73, No. 26, Dec. 28, 1998, pp. 3878-3880.
(Continued)

*Primary Examiner*—Minsun Harvey
*Assistant Examiner*—Patrick Stafford
(74) *Attorney, Agent, or Firm*—Workman Nydegger

(57) ABSTRACT

In order to provide excellent device characteristics and enhance fabrication yield and run-to-run reproducibility in a buried device structure using a low mesa on a p-type substrate, a cross sectional configuration before growth of a contact layer of a device, i.e., after growth of an over-cladding layer is flattened so as not to cause a problem in crystal quality of the contact layer. A mesa-stripe stacked body including at least a p-type cladding layer (2), an active layer (4) and an n-type cladding layer (6) is formed on a p-type semiconductor substrate (1), a current-blocking layer (8) is buried in both sides of the stacked body, and an n-type over-cladding layer (9) and an n-type contact layer (10) are disposed on the current-blocking layer (8) and the stacked body. The n-type over-cladding layer (9) is made of a semiconductor crystal having a property for flattening a concavo-convex shape of upper surfaces of the current-blocking layer (8) and the stacked body.

4 Claims, 11 Drawing Sheets

U.S. PATENT DOCUMENTS

| | | |
|---|---|---|
| 6,300,153 B1 | 10/2001 | Koui |
| 2001/0030327 A1 | 10/2001 | Furushima |
| 2002/0168856 A1* | 11/2002 | Iga et al. .................... 438/689 |
| 2003/0067010 A1 | 4/2003 | Iga et al. |
| 2004/0057483 A1 | 3/2004 | Takemi et al. |

FOREIGN PATENT DOCUMENTS

| | | |
|---|---|---|
| JP | 3-53582 | 3/1991 |
| JP | 05-021891 | 1/1993 |
| JP | 05-102607 | 4/1993 |
| JP | 06-177482 | 6/1994 |
| JP | 06-283816 | 10/1994 |
| JP | 07-162091 | 6/1995 |
| JP | 07-202317 | 8/1995 |
| JP | 08-250808 | 9/1996 |
| JP | 09-283846 | 10/1997 |
| JP | 2000-260714 | 9/2000 |
| JP | 2000-307195 | 11/2000 |
| JP | 2001-298240 | 1/2001 |
| JP | 2003-60311 | 2/2003 |
| JP | 2004-119467 | 4/2004 |

OTHER PUBLICATIONS

A. van Geelen et al., *Ruthenium Doped High Power 1.48 μm STPBH Laser*, 11th International Conference on Indium Phosphide and Related Materials, Davos, Switzerland, May 16-20, 1999, TuB 1-2, pp. 203-206.

Ryuzo Iga et al., *Ruthenium-Doped InP Buried 1.3 μm DFB Lasers on a P-Type Substrate*, 2004 International Conference on Indium Phosphide and Related Materials, Conference Proceedings, 16th IPRM, Kagoshima, Japan, May 31-Jun. 4, 2004, pp. 742-745.

Ryuzo Iga et al., *Directly Modulated 1.3 μm DFB Lasers with a Buried Heterostructure Using Ru-doped Semi-Insulating InP*, Technical Report of IEICE, EMD2004-43, CPM2004-69, OPE2004-126, LQE2004-41(Aug. 2004), pp. 19-24 (only Abstract is attached).

Ryuzo Iga et al., *Directly Modulated 1.3-μm DFB Laser with a Buried Structure Formed by Using Ru-doped Semi-insulating InP*, 31p-ZH-10, 2005 (all the document is translated).

* cited by examiner

SEMICONDUCTOR OPTICAL DEVICE AND A METHOD OF FABRICATING THE SAME

TECHNICAL FIELD

The present invention relates to a semiconductor optical device and a method of fabricating the same.

BACKGROUND ART

A buried structure having a semiconductor crystal as a current-blocking burying layer is used in a semiconductor optical device such as a semiconductor laser. This structure is very important in the practical use of a device because it has advantages such as reduction in threshold current of a semiconductor laser due to a good current-blocking, stabilization of an optical beam by transverse mode control, good heat dissipation from an active layer due to a semiconductor burying layer, and high long-term reliability.

A directly modulated laser which is one of components necessary for a large capacity optical transmission system is an important component as a light source of a middle/short-distance high speed optical transmission system. Thus, reduction in cost is strongly required for the directly modulated laser. More specifically, in order to reduce the cost, it becomes necessary to operate the directly modulated laser under an uncooled condition in which no cooling system such as a Peltier element is used in the mounting of the laser device, and improve fabrication yield. Consequently, the characteristics permitting the directly modulated laser to operate at a higher temperature and at a high speed are desired.

In order that the directly modulated laser may operate at the higher temperature and at the high speed, it is required to reduce a capacitance of the laser device and increase an light output power efficiency at a high temperature. As for the principles of an operation of this directly modulated laser, a light output power of the laser is directly modulated by modulating an injection current to the laser. A modulation speed is limited by a relaxation oscillation frequency and a device capacitance of the laser. The modulation speed increases as the relaxation oscillation frequency becomes higher. In order to increase the relaxation oscillation frequency, it is necessary to reduce lifetime of photons and increase a differential gain and photon density.

The semiconductor buried structure is roughly classified into buried structures using a high mesa and a low mesa. As for the buried structure using a high mesa, a lower cladding layer, an active layer, an upper cladding layer, and a contact layer are formed on a substrate successively. Moreover, a high stripe-like mesa which is about 2 µm in mesa width and about 3 µm in mesa height is formed by using a dielectric mask, and a current-blocking layer is buried in both sides of the mesa to be grown, thereby forming the buried structure using a high mesa.

On the other hand, as for the buried structure using a low mesa, a lower cladding layer, an active layer, and a part of an upper cladding layer are formed on a substrate successively, and a low stripe-like mesa which is about 2 µm in mesa width and about 1.5 µm in mesa height is formed by using a dielectric mask. Moreover, after a current-blocking layer is buried in the both sides of the mesa to be grown and the dielectric mask is then removed, an upper over-cladding layer and a contact layer are grown, thereby completing the buried structure using a low mesa. In order to enhance the light output power efficiency at the high temperature in the laser device such as the directly modulated semiconductor laser, the buried structure using a low mesa is suitable for attaining this rather than the buried structure using a high mesa. The reason for this is that a device resistance can be reduced since an area of an upper electrode obtained in the buried structure using a low mesa can take a larger value than that in the buried structure using a high mesa.

In addition, since the buried structure using a low mesa is low in mesa height, the burying growth for the buried structure using a low mesa is easier than that for the buried structure using a high mesa and thus the irregular crystal growth hardly occurs. As a result, it is possible to form the burying layer which is excellent in crystal quality. However, in case of the buried structure using a low mesa, in order to obtain the thickness of the burying layer required to sufficiently operate the current-blocking, the height of the surface of the burying layer becomes higher than that of the mesa. Thus, the surface after the burying growth is performed for the mesa has a concavo-convex shape. When the over-cladding layer and the contact layer are further grown on the surface having the concavo-convex shape, the concavo-convex shape remains on the contact layer as well. Though the over-cladding layer is ordinarily a binary semiconductor compound crystal, since the contact layer is ordinarily made of a semiconductor compound alloy crystal such as a ternary or more complex alloy crystal, the composition change of the contact layer occurs. As a result, the lattice mismatch is generated between the over-cladding layer and the contact layer. Thus, there is encountered such a problem that the degradation of the crystal quality due to the strain is caused.

This problem causes the degradation of the in-plane fabrication yield and run-to-run reproducibility as well as the degradation of the device characteristics. Thus, the concavo-convex shape before the growth of the contact layer, i.e., after the growth of the over-cladding layer needs to be flattened so as not to cause a problem in the crystal quality of the contact layer.

In addition, the conductivity type of the substrate served to the fabrication of the semiconductor optical device exerts a large influence on the device characteristics. A lower substrate electrode able to obtain a large contact area is made of a p-type semiconductor whose contact resistance is larger than that of an n-type semiconductor, whereby the device resistance can be reduced and thus the device characteristics can be enhanced. When the substrate is a p-type substrate, the directly modulated semiconductor laser for which the high speed operation is required has an advantage of obtaining compatibility with an non-type transistor circuit which is excellent in high speed operation. Consequently, in the semiconductor laser device, especially, in the directly modulated laser, the buried structure using a low mesa on the p-type substrate is effective. Moreover, a device structure which has excellent device characteristics and with which the fabrication yield and the run-to-run reproducibility are enhanced, and a fabrication method thereof are essential to reduction in cost of the device.

[Patent document 1] U.S. Pat. No. 5,470,785

[Non-patent document 1] A. Dadgar et al, "Ruthenium: A superior compensator of InP", Applied Physics Letters Vol. 73, No. 26, pp. 3878-3880, 1998

[Non-patent document 2] A. van Geelen et al, "Ruthenium doped higher power 1.48 µm SIPBH laser", 11th International conference on Indium Phosphide and related materials Tubl-2, 1999

DISCLOSURE OF THE INVENTION

There is encountered such a problem that the concavo-convex shape before the growth of the contact layer, i.e., after the growth of the over-cladding layer must be flattened so as not to cause a problem in the crystal quality of the contact layer in order to provide the excellent device characteristics and enhance the fabrication yield and the run-to-run reproducibility in the buried structure using a low mesa on the p-type substrate.

In order to solve the above-mentioned problem, in a semiconductor optical device in which a mesa-stripe stacked body including at least a p-type cladding layer, an active layer, and an n-type cladding layer is formed on a p-type semiconductor substrate, a current-blocking layer is buried in both sides of the stacked body, and an n-type over-cladding layer and an n-type contact layer are regrown on the current-blocking layer and the stacked body. The n-type over-cladding layer is made of a semiconductor crystal having a property for flattening the concavo-convex shape of upper surfaces of the current-blocking layer and the stacked body.

Preferably, an n-type dopant for the semiconductor crystal is a group VI element, and moreover selenium is suitable for the n-type dopant for the semiconductor crystal. In addition, doping concentration of selenium is suitably equal to or higher than $5 \times 10^{18}$ cm$^{-3}$.

BEST MODE FOR CARRYING OUT THE INVENTION

Figure 1A:
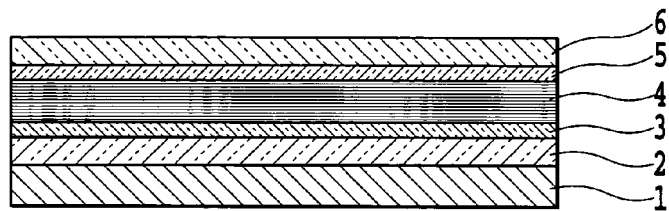
FIG. 1A is a cross sectional view showing a process for fabricating a semiconductor device according to Embodiment 1 of the present invention.

Hereinafter, embodiments of the present invention will be described in detail with reference to the drawings. Normally, a cross sectional configuration of a device after burying growth is performed for a low mesa structure formed on a p-type substrate becomes a cross sectional configuration having the concavo-convex shape. Thus, with the conventional method, after an over-cladding layer and a contact layer are formed, the concavo-convex shape remains. As a result, it becomes difficult to control the crystal quality of the contact layer using an alloy crystal such as a ternary or more complex alloy crystal, which remarkably degrades the characteristics of the device. Thus, in embodiments, after the burying growth is performed for a low mesa structure, an over-cladding layer is used which is made of a crystal having a property for flattening a cross sectional configuration having irregularity.

The embodiments are devices having a buried structure using a low mesa which is formed on a p-type substrate. After a current-blocking layer is buried in both sides of a mesa, the over-cladding layer is used which is made of the crystal having the property for flattening the concavo-convex shape of a surface after the burying growth is performed for the mesa, thereby obtaining the crystal quality of the contact layer not degrading the device characteristics. Since the over-cladding layer made of the crystal having the property for flattening the concavo-convex shape of the surface is used in the manner described above, even when the surface having the concavo-convex shape is formed after the current-blocking layer is buried in the both sides of the mesa, the surface of the over-cladding layer becomes flat. For this reason, even when the contact layer is formed on the over-cladding layer, it is possible to obtain the contact layer not degrading the device characteristics.

An example of the over-cladding layer for flattening the concavo-convex shape of the surface after the burying growth is performed for the mesa is a semiconductor crystal doped with selenium (Se). The over-cladding layer has a large flattening effect as the concentration of Se for doping is higher. It is desirable that the doping concentration of Se is equal to or higher than $5 \times 10^{18}$ cm$^{-3}$. More specifically, in a device having a buried structure using a low mesa which is formed on a p-type InP substrate, an InP crystal having Se doping concentration of $5 \times 10^{18}$ cm$^{-3}$ or more is used as the n-type over-cladding layer, whereby the results are obtained which are more effective in flattening. The details will be described later with reference to Embodiment 1.

As regards the buried structure which can be applied to the device having the buried structure using a low mesa, there are a structure formed of only a high-resistive burying layer using a semi-insulating semiconductor crystal, a pn-type semiconductor buried structure, and a buried structure using both a semi-insulating semiconductor crystal and an n-type semiconductor crystal. The excellent effects in the embodiments can be obtained in any of those buried structures. In the three kinds of buried structures described above, it is desirable that a current-blocking buried structure of the device is a simple structure in order to further enhance the device characteristics, in-plane fabrication yield, and run-to-run reproducibility of the buried structure using a low mesa.

A complicated multilayer buried structure becomes a main factor that causes the degradation of the device characteristics due to an increase in leakage current, the reduction in yield within a substrate plane, and the reduction in run-to-run reproducibility. In order to make the current-blocking buried structure a simple structure, preferably a structure using only a semi-insulating semiconductor crystal is used. Heretofore, a semiconductor crystal doped with iron (Fe) has been used as the high-resistive burying layer using the semi-insulating semiconductor crystal. However, there is encountered such a problem that Fe as the dopant and zinc (Zn) as a dopant for the p-type semiconductor crystal causes inter-diffusion in a burying growth interface.

As a result, since Zn deeply diffuses into a burying layer doped with Fe to degrade the semi-insulating property of the burying layer, thereby degrading the current-blocking property, this becomes a main factor that causes the degradation of the device characteristics. In recent years, it has been found out that the semi-insulating semiconductor crystal doped with Ru hardly causes the inter-diffusion with Zn, and thus the semiconductor laser using the semi-insulating burying layer containing Ru as a dopant on the n-type InP substrate has been fabricated (refer to Non-patent documents 1 and 2 for example). Thus, when a high-resistive layer made of a semi-insulating crystal containing Ru as a dopant is buried, a simple buried structure is realized. As a result, the excellent effects are obtained because of enhancement of the device characteristics, the fabrication yield, and the reproducibility.

According to the embodiments, it is possible to realize the excellent device characteristics, the enhancement of the fabrication yield within a substrate plane, and the satisfactory run-to-run reproducibility. In addition, when the high-resistive layer made of the semi-insulating crystal containing Ru as a dopant is buried, a simple buried structure is realized. As a result, the satisfactory effects are obtained because of enhancement of the device characteristics, the fabrication yield, and the reproducibility. In particular, when the present invention is applied to the directly modulated semiconductor laser, the cost can be reduced.

Embodiment 1

FIGS. 1A to 1G show processes for fabricating a semiconductor device according to a first embodiment of the present invention. These figures are cross sectional views of a directly modulated semiconductor DFB laser using an MQW as an active layer. Firstly, as shown in FIG. 1A, a Zn-doped p-type InP cladding layer 2 having a layer thickness of 0.5 µm, a nondoped-InGaAsP lower separate confinement heterostructure (SCH) layer 3 having a layer thickness of 0.05 µm, a non-doped InGaAsP/InGaAsP strain multiple quantum well (MQW) active layer 4 having a layer thickness of 0.15 µm and having a bandgap wavelength of 1.3 µm, and a non-doped InGaAsP upper separate confinement heterostructure (SCH) layer 5 having a layer thickness of 0.05 µm were grown in order on a Zn-doped p-type InP substrate 1 having surface orientation (100) by utilizing a metal organic vapor-phase epitaxy (MOVPE) method. After a diffraction grating was formed on an upper portion of the InGaAsP upper separate confinement heterostructure (SCH) layer 5, a Se-doped n-type InP cladding layer 6 having a layer thickness of 0.2 µm was grown.

Figure 1B:
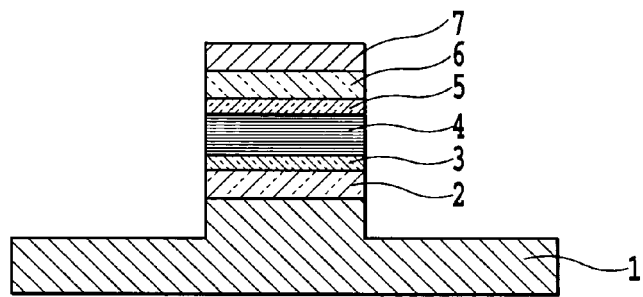
FIG. 1B is a cross sectional view showing a process for fabricating a semiconductor device according to Embodiment 1 of the present invention.
Figure 1C:
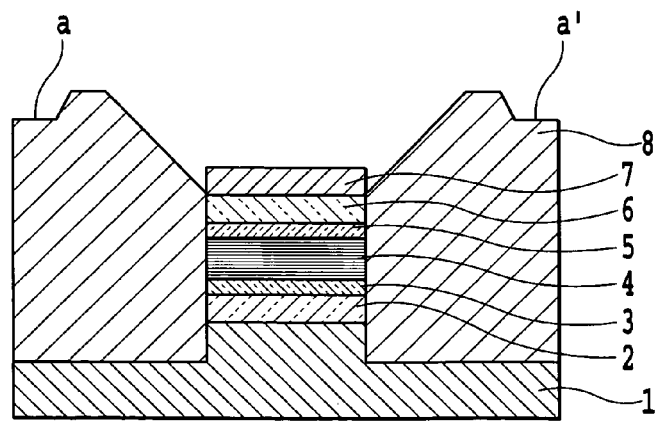
FIG. 1C is a cross sectional view showing a process for fabricating a semiconductor device according to Embodiment 1 of the present invention.

Next, as shown in FIG. 1B, a mesa stripe which was 2 µm in width and about 1.5 µm in height was formed with SiO$_2$ as a mask 7 by utilizing reactive ion etching (RIE). Subsequently, as shown in FIG. 1C, a Ru-doped InP layer 8 (having a layer thickness of 3 µm) was grown as a current-blocking layer on the substrate on both sides of the mesa stripe by utilizing the MOVPE method. Bis(ethylcyclopentadienyl)ruthenium (II) was used as a source material for Ru. A layer thickness of the Ru-doped InP layer 8 was 3 µm in a flat region (reference symbols a, a' in FIG. 1C) which was at a distance from a rising buried region in the vicinity of the mesa.

Figure 1D:
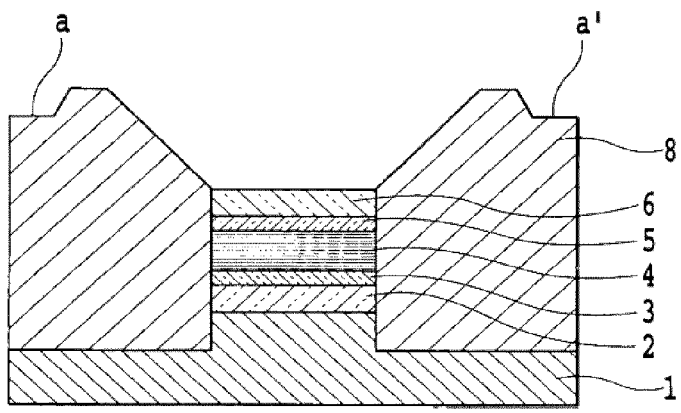
FIG. 1D is a cross sectional view showing a process for fabricating a semiconductor device according to Embodiment 1 of the present invention.
Figure 1E:
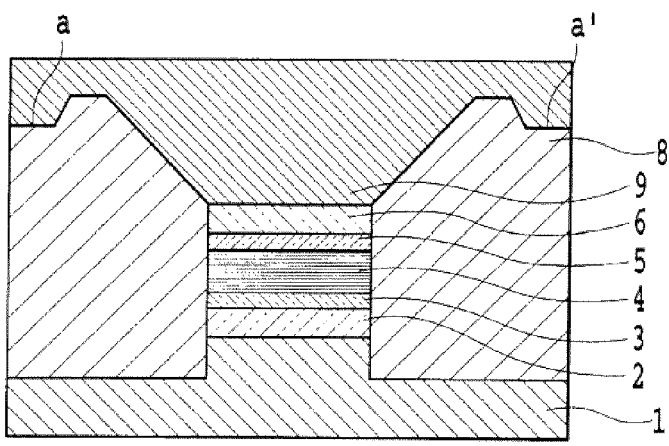
FIG. 1E is a cross sectional view showing a process for fabricating a semiconductor device according to Embodiment 1 of the present invention.

As shown in FIG. 1D, when the mask 7 made of SiO$_2$ was removed, a V-shaped-like groove having a depth of 1.5 µm or more was formed. In order to flatten this groove, as shown in FIG. 1E, an n-type InP over-cladding layer 9 doped with Se was grown by utilizing the MOVPE.

Figure 2A:
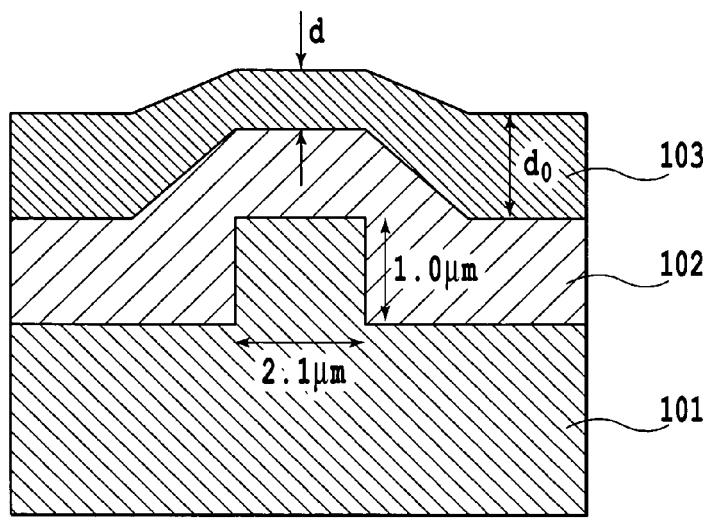
FIG. 2A is a cross sectional view showing a structure of a device whose degree of flattening is measured.

A description will be given with respect to concentration of Se with which the over-cladding layer is doped. Kondo as one of the inventors of this application makes it clear that as the doping concentration of Se increases, the degree of flattening increases (refer to Patent document 1 for example). An influence of the doping concentration of Se exerted on the degree of flattening will be described based on this fact. The degree of flattening when as shown in FIG. 2A, a Zn-doped p-type InP (102) having a layer thickness of 1.0 µm was grown over a mesa 101 which was 2.1 µm in width and 1.0 µm in height, and a Se-doped n-type InP (103) having a layer thickness of 0.8 µm was further grown was measured. A layer thickness of the Se-doped n-type InP (103) over the mesa is assigned d, a layer thickness of a flat region at a distance from the mesa is assigned $d_0$, and the degree of flattening is assigned $d/d_0$. That is, this means that the degree of flattening is higher as $d/d_0$ becomes smaller.

Figure 2B:
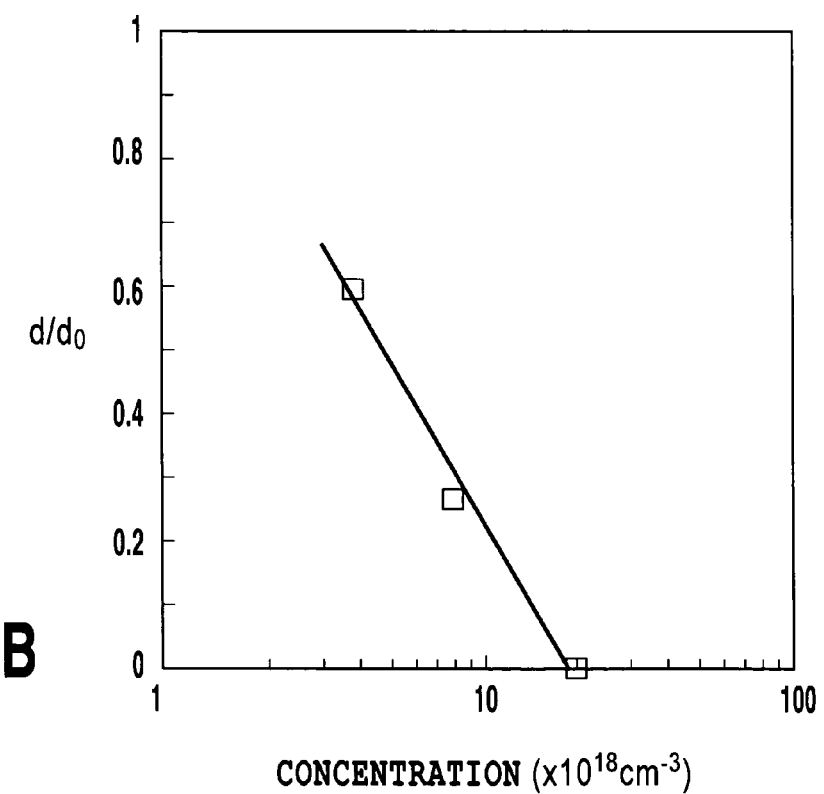
FIG. 2B is a diagram showing a relationship between doping concentration of Se and the degree of flattening.

FIG. 2B shows a relationship between the doping concentration of Se and the degree of flattening. It is understood that as the doping concentration of Se increases, $d/d_0$ decreases and thus the degree of flattening becomes high. Then, the doping concentration of Se at which $d/d_0$ became equal to or smaller than ½ was equal to or higher than $5 \times 10^{18}$ cm$^{-3}$.

In this embodiment, if the layer thickness of the n-type InP over-cladding layer doped with Se fulfills a relationship of $d/d_0 < \frac{1}{2}$, the concavo-convex shape of the groove can be flattened while an increase in layer thickness in the flat region is suppressed as much as possible, and thus this process can be applied to the fabrication of the device.

Incidentally, while the doping of Se has been described here, it is known that with respect to sulfur (S) and tellurium (Te) as well which belong to the same group VI element as that of Se, as the doping concentration increases, the degree of flattening increases.

As shown in FIG. 1E, an n-type InP over-cladding layer 9 having a layer thickness of 2 μm and having Se doping concentration of $6 \times 10^{18}$ cm$^{-3}$ was grown by utilizing the MOVPE, thereby flattening the concavo-convex shape after growth of the current-blocking layer. Here, the layer thickness of the n-type InP over-cladding layer 9 means a thickness in a flat region (reference symbols a, a' in FIG. 1E) of the Ru-doped InP layer 8 at a distance from a rising buried region thereof in the vicinity of the mesa.

Figure 1F:
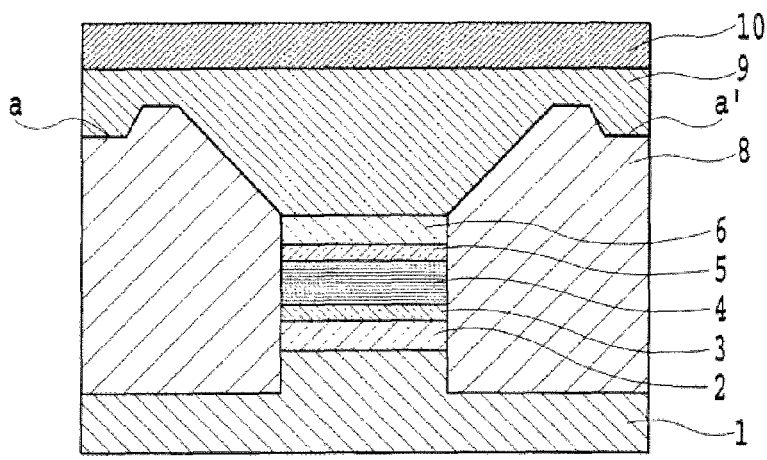
FIG. 1F is a cross sectional view showing a process for fabricating a semiconductor device according to Embodiment 1 of the present invention.

Thereafter, as shown in FIG. 1F, an n-type indium gallium arsenide phosphorus (InGaAsP) contact layer 10 having a layer thickness of 0.4 μm and containing Se as a dopant was grown by utilizing the MOVPE. Each compound semiconductor other than that of the active layer has composition lattice-matching with the InP substrate unless especially notice is given.

Figure 1G:
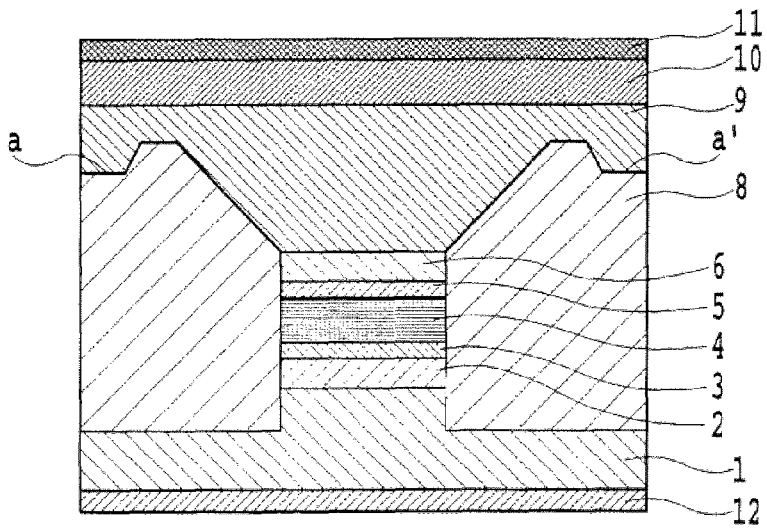
FIG. 1G is a cross sectional view showing a process for fabricating a semiconductor device according to Embodiment 1 of the present invention.

Next, as shown in FIG. 1G, an n-type electrode 11 was formed and a p-type electrode 12 was formed on a substrate side. Thereafter, while not illustrated, in order to reduce a capacitance of the whole device as much as possible, the unnecessary Ru-doped InP layer 8, n-type InP over-cladding layer 9 and contact layer 10 which were at a distance from the mesa stripe shown in FIG. 1B were etched away by utilizing dry etching, thereby obtaining such a mesa structure as to include the mesa stripe. At this time, reducing the layer thickness of the whole device as much as possible is advantageous in that the mesa structure is easy to optimize, the device capacitance can be reduced, and no device characteristics are degraded. On the other hand, in order to reduce the device capacitance and reduce a forward leakage current, it is advisable to increase the layer thickness of the Ru-doped InP layer 8 as the semi-insulating layer as much as possible. Consequently, when the layer thickness of the n-type InP over-cladding layer 9 is reduced as much as possible, this is advantageous in enhancement of the device characteristics since an increase in layer thickness of the whole device can be suppressed. When the concavo-convex shape of the groove is flattened, if the doping concentration of Se is increased, so that the flattening can be made with the thinner n-type InP over-cladding layer 9, the effects of the present invention become more remarkable.

Figure 3:
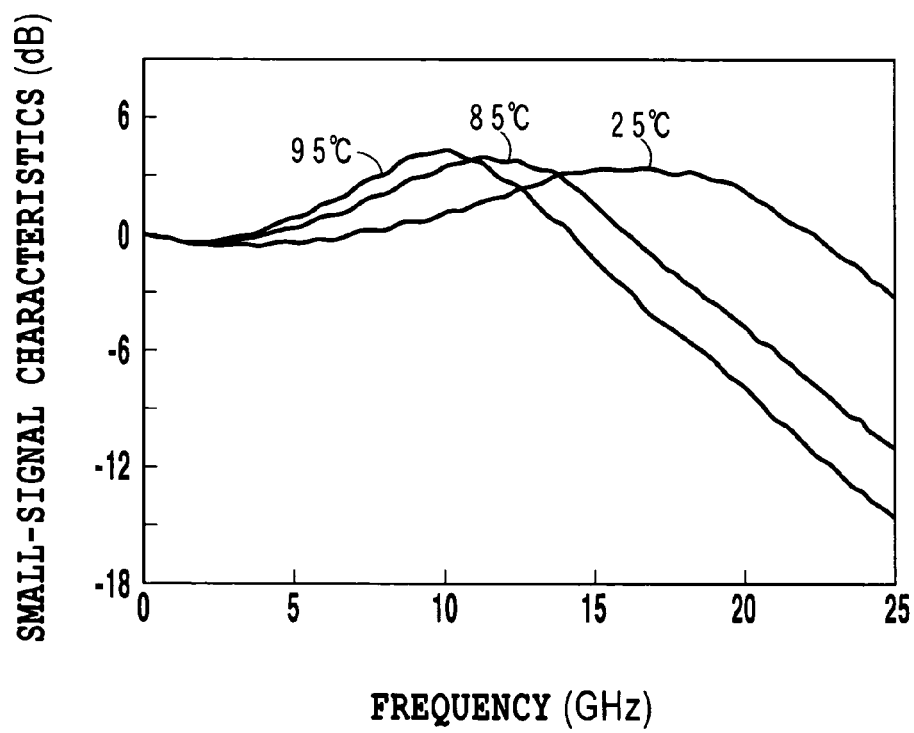
FIG. 3 is a diagram showing dependence of optical small-signal response characteristics of a directly modulated semiconductor laser on a temperature.

FIG. 3 shows dependence of optical small-signal response characteristics of a directly modulated semiconductor laser fabricated by using the method described above on a temperature. A 3-dB bandwidth of the semiconductor laser is about 25 GHz at a chip temperature of 25° C., about 18 GHz at 85° C., and about 15 GHz at 95° C. A threshold current is about 6 mA at the chip temperature of 25° C., and about 32 mA at 95° C. Light output power efficiency is about 0.38 W/A at the chip temperature of 25° C., and about 0.16 W/A at 95° C.

On the other hand, when the Se doping concentration of the n-type InP over-cladding layer 9 is lower than $5 \times 10^{18}$ cm$^{-3}$, the flattening of the concavo-convex shape of the surface is insufficient. As a result, the crystal quality of the n-type InGaAsP contact layer 10 is degraded to cause the degradation of the device characteristics.

Next, a description will be given with respect to a case where the layer thickness of the Ru-doped InP layer 8 is further increased. A directly modulated semiconductor laser was fabricated under the conditions in which the Se doping concentration for the n-type InP over-cladding layer 9 was set to $8 \times 10^{18}$ cm$^{-3}$, and the layer thickness of the n-type InP over-cladding layer 9 was set to 1 μm. At this time, the layer thickness of the Ru-doped InP layer 8 was 4 μm. A 3-dB bandwidth of the optical small-signal response characteristics of the directly modulated semiconductor laser was about 28 GHz at the chip temperature of 25° C., and about 17 GHz at 95° C. The threshold current was about 5 mA at the chip temperature of 25° C., and about 27 mA at 95° C. The light output power efficiency was about 0.40 W/A at the chip temperature of 25° C., and about 0.18 W/A at 95° C. Comparing the device characteristics of this directly modulated laser with those of the directly modulated laser shown in FIG. 3, it is understood that the device characteristics are enhanced.

Moreover, a directly modulated semiconductor laser was fabricated under the condition in which the Se doping concentration for the n-type InP over-cladding layer 9 was set to $2 \times 10^{19}$ cm$^{-3}$. At this time, the layer thickness of the Ru-doped InP layer 8 was 5 μm. The n-type InP over-cladding layer 9 was hardly grown in the flat region of the Ru-doped InP layer 8 at a distance from the rising buried region thereof in the vicinity of the mesa, and thus was grown while maintaining the V-shaped-like groove structure, thereby flattening the concavo-convex shape. The 3-dB bandwidth of the optical small-signal response characteristics of the directly modulated semiconductor laser was about 30 GHz at the chip temperature of 25° C., and about 19 GHz at 95° C. The threshold current was about 5 mA at the chip temperature of 25° C., and about 24 mA at 95° C. The light output power efficiency was about 0.42 W/A at the chip temperature of 25° C., and about 0.20 W/A at 95° C. Comparing the device characteristics of this directly modulated laser with those of the directly modulated lasers described above, it is understood that the device characteristics are further enhanced.

In such a manner, an increase in layer thickness of the Ru-doped InP layer 8 as the current-blocking layer reduces the forward leakage current of the directly modulated semiconductor laser. Hence, the light output power efficiency increases and the device capacitance decreases, so that the modulation characteristics are remarkably enhanced.

Heretofore, it has been tried to increase the layer thickness of the semi-insulating layer as the current-blocking layer to enhance the device characteristics. However, an increase in layer thickness of the semi-insulating layer made the concavo-convex shape of the groove deep. As a result, it became difficult to bury the over-cladding layer in the groove to flatten the concavo-convex shape, and also the total layer thickness of the device increased. On the other hand, if the layer thickness of the over-cladding layer is further reduced, this caused such a problem that it was more difficult to flatten the concavo-convex shape. According to this embodiment mode, the n-type InP over-cladding layer having the Se doping concentration of $5 \times 10^{18}$ cm$^{-3}$ or more is used, whereby it is possible to form the thinner over-cladding layer and the thicker semi-insulating layer. Hence, it is possible to enhance the device characteristics of the directly modulated semiconductor laser.

Embodiment 2

Figure 4A:
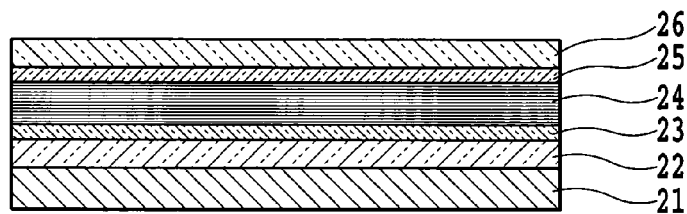
FIG. 4A is a cross sectional view showing a process for fabricating a semiconductor device according to Embodiment 2 of the present invention.

FIGS. 4A to 4G show processes for fabricating a semiconductor device according to a second embodiment of the present invention. These figures are cross sectional views showing a directly modulated semiconductor DFB laser having an MQW as an active layer. Firstly, as shown in FIG. 4A, a Zn-doped n-type InP cladding layer 22 having a layer thickness of 0.5 µm, a nondoped-InGaAsP lower separate confinement heterostructure (SCH) layer 23 having a layer thickness of 0.05 µm, a nondoped-InGaAsP/InGaAsP strain multiple quantum well (MQW) active layer 24 having a layer thickness of 0.15 µm and having a bandgap wavelength of 1.3 µm, and a nondoped-InGaAsP upper separate confinement heterostructure (SCH) layer 25 having a layer thickness of 0.05 µm were grown in order on a Zn-doped p-type InP substrate 21 having surface orientation (100) by utilizing the metal organic vapor-phase epitaxy (MOVPE) method. After a diffraction grating was formed on an upper portion of the InGaAsP upper separate confinement heterostructure (SCH) layer 25, a Se-doped n-type InP cladding layer 26 having a layer thickness of 0.2 µm was grown.

Figure 4B:
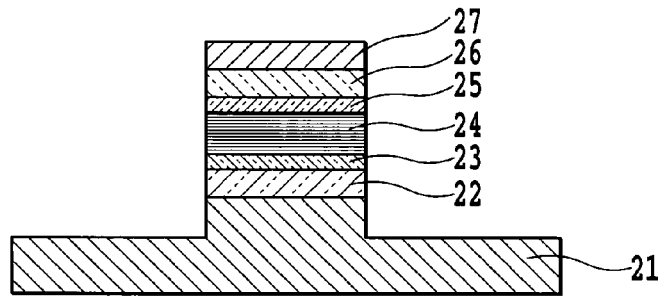
FIG. 4B is a cross sectional view showing a process for fabricating a semiconductor device according to Embodiment 2 of the present invention.
Figure 4C:
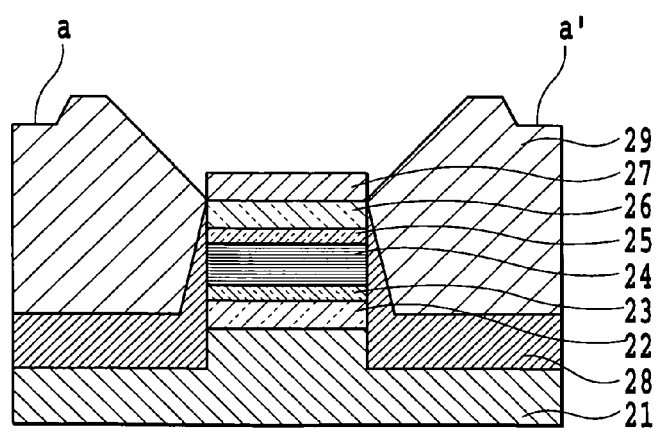
FIG. 4C is a cross sectional view showing a process for fabricating a semiconductor device according to Embodiment 2 of the present invention.

Next, as shown in FIG. 4B, a mesa stripe which was 2 µm in width and about 1.5 µm in height was formed with $SiO_2$ as a mask by utilizing the reactive ion etching (RIE). Subsequently, as shown in FIG. 4C, an n-type InP layer 28 (having a layer thickness of 0.5 µm) was grown as a current-blocking layer and an Fe-doped InP layer 29 (having a layer thickness of 3 µm) was grown by utilizing the MOVPE method. Ferrocene was used as a source material for Fe.

Figure 4D:
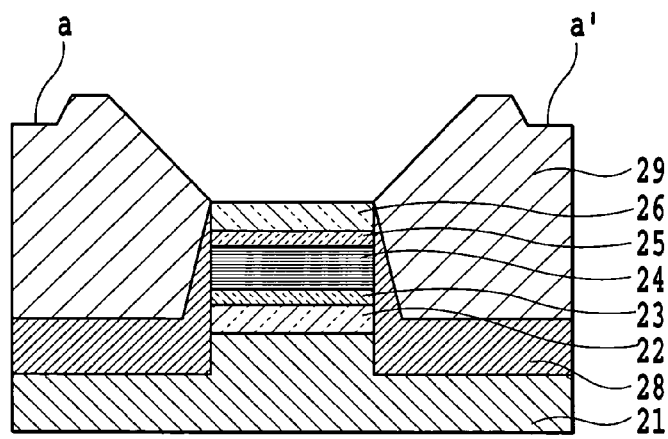
FIG. 4D is a cross sectional view showing a process for fabricating a semiconductor device according to Embodiment 2 of the present invention.
Figure 4E:
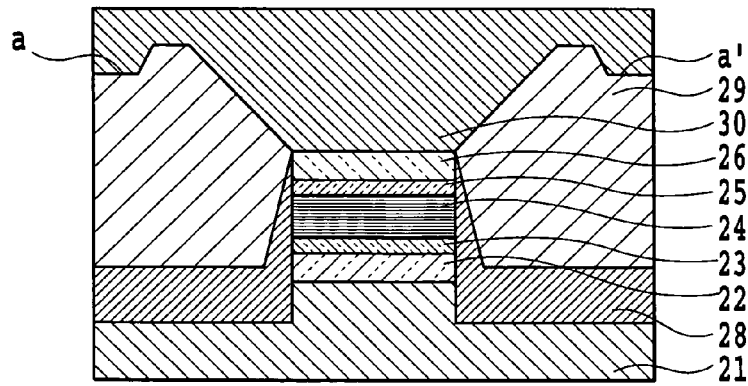
FIG. 4E is a cross sectional view showing a process for fabricating a semiconductor device according to Embodiment 2 of the present invention.

As shown in FIG. 4D, when the mask 27 made of $SiO_2$ was removed, a V-shaped-like groove was formed. In order to flatten the concavo-convex shape of this groove, as shown in FIG. 4E, an n-type InP over-cladding layer 30 having a layer thickness of 2 µm and having Se doping concentration of $6\times10^{18}$ $cm^{-3}$ was grown by utilizing the MOVPE.

Figure 4F:
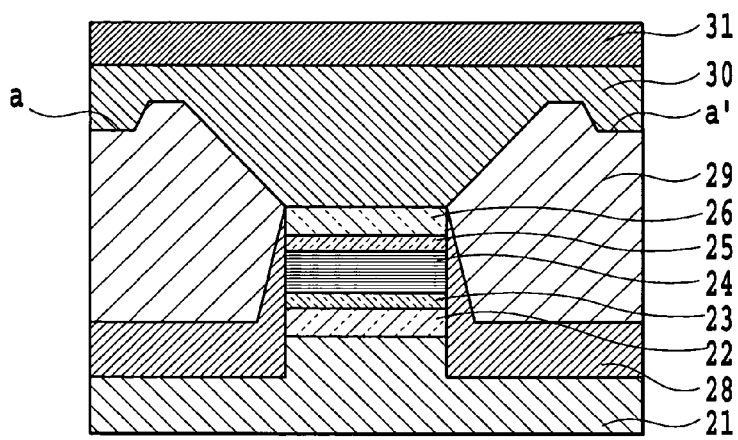
FIG. 4F is a cross sectional view showing a process for fabricating a semiconductor device according to Embodiment 2 of the present invention.

Thereafter, as shown in FIG. 4F, an n-type indium gallium arsenide phosphorus (InGaAsP) contact layer 31 having a layer thickness of 0.4 µm and containing Se as a dopant was grown by utilizing the MOVPE. Each compound semiconductor other than that of the active layer has composition lattice-matching with the InP substrate unless especially notice is given.

Figure 4G:
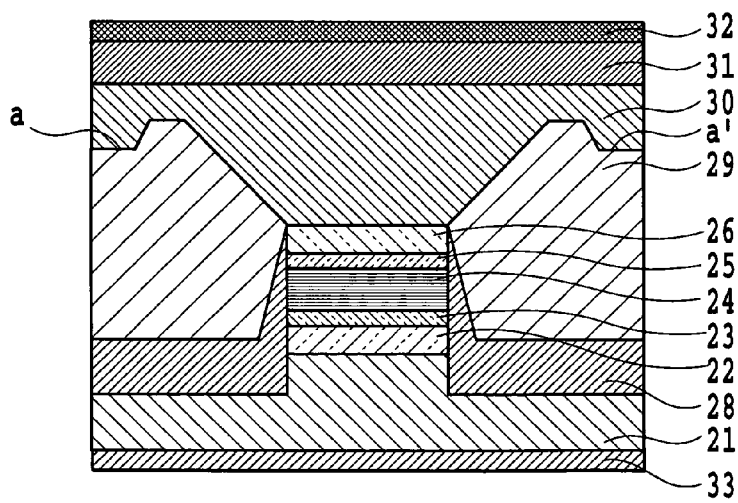
FIG. 4G is a cross sectional view showing a process for fabricating a semiconductor device according to Embodiment 2 of the present invention.

Next, as shown in FIG. 4G, an n-type electrode 32 was formed and a p-type electrode 33 was formed on the substrate side. Thereafter, the same mesa processing as that in Embodiment 1 was performed.

The optical small-signal response characteristics of a directly modulated semiconductor laser fabricated by using the method described above were measured. The 3-dB bandwidth of the semiconductor laser is about 22 GHz at the chip temperature of 25° C., and about 11 GHz at 95° C. The threshold current is about 7 mA at the chip temperature of 25° C., and about 35 mA at 95° C. The light output power efficiency is about 0.35 W/A at the chip temperature of 25° C., and about 0.15 W/A at 95° C.

Embodiment 3

Figure 5A:
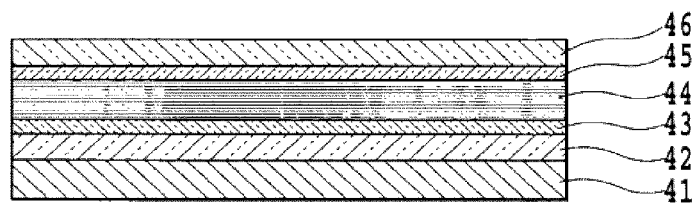
FIG. 5A is a cross sectional view showing a process for fabricating a semiconductor device according to Embodiment 3 of the present invention.

FIGS. 5A to 5G show processes for fabricating a semiconductor device according to a third embodiment of the present invention. These figures are cross sectional views of a directly modulated semiconductor DFB laser having an MQW as an active layer. Firstly, as shown in FIG. 5A, a Zn-doped p-type InP cladding layer 42 having a layer thickness of 0.5 µm, a nondoped-InGaAsP lower separate confinement heterostructure (SCH) layer 43 having a layer thickness of 0.05 µm, a nondoped-InGaAsP/InGaAsP strain multiple quantum well (MQW) active layer 44 having a layer thickness of 0.15 µm and having a bandgap wavelength of 1.3 µm, and a nondoped-InGaAsP upper separate confinement heterostructure (SCH) layer 45 having a layer thickness of 0.05 µm were successively grown on a Zn-doped p-type InP substrate 41 having surface orientation (100) by utilizing the metal organic vapor-phase epitaxy (MOVPE) method. After a diffraction grating was formed on an upper portion of the InGaAsP upper separate confinement heterostructure (SCH) layer 45, a Se-doped n-type InP cladding layer 46 was grown.

Figure 5B:
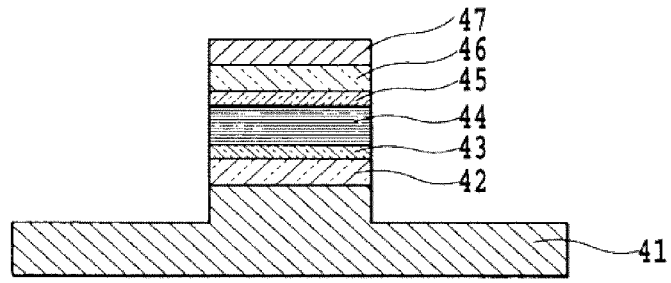
FIG. 5B is a cross sectional view showing a process for fabricating a semiconductor device according to Embodiment 3 of the present invention.
Figure 5C:
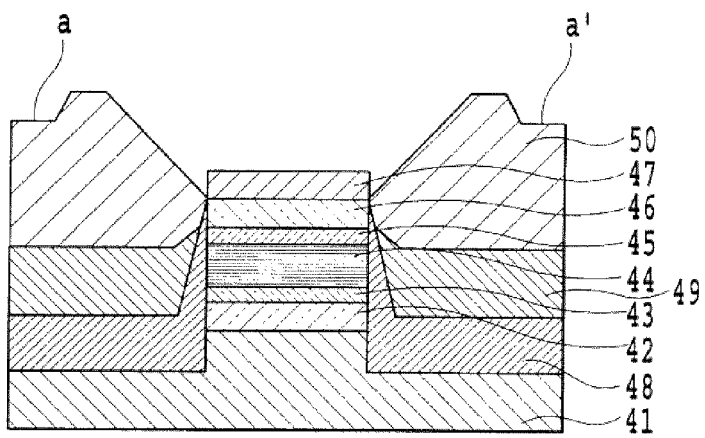
FIG. 5C is a cross sectional view showing a process for fabricating a semiconductor device according to Embodiment 3 of the present invention.

Next, as shown in FIG. 5B, a mesa stripe which was 2 µm in width and 1.5 µm in height was formed with $SiO_2$ as a mask 47 by utilizing the reactive ion etching (RIE). Subsequently, as shown in FIG. 5C, a p-type InP layer 48 (having a layer thickness of 0.6 µm), an n-type InP layer 49 (having a layer thickness of 0.6 µm), and a p-type InP layer 50 (having a layer thickness of 0.6 µm) were successively grown as a current-blocking layer on the both sides of the mesa stripe by utilizing the MOVPE method.

Figure 5D:
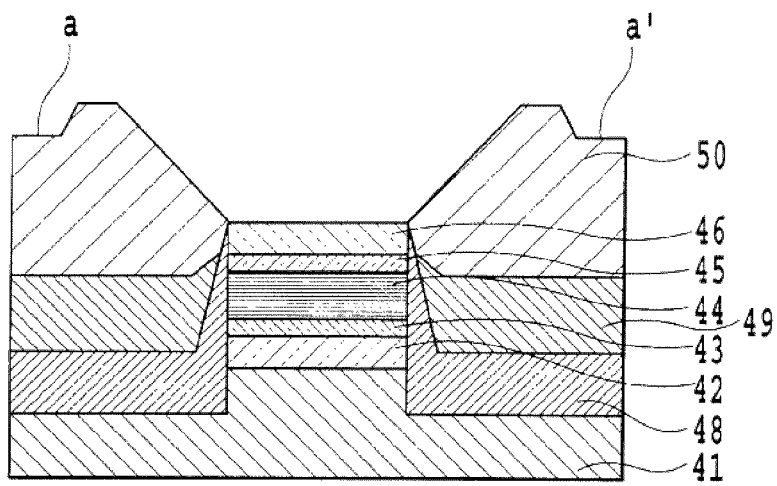
FIG. 5D is a cross sectional view showing a process for fabricating a semiconductor device according to Embodiment 3 of the present invention.
Figure 5E:
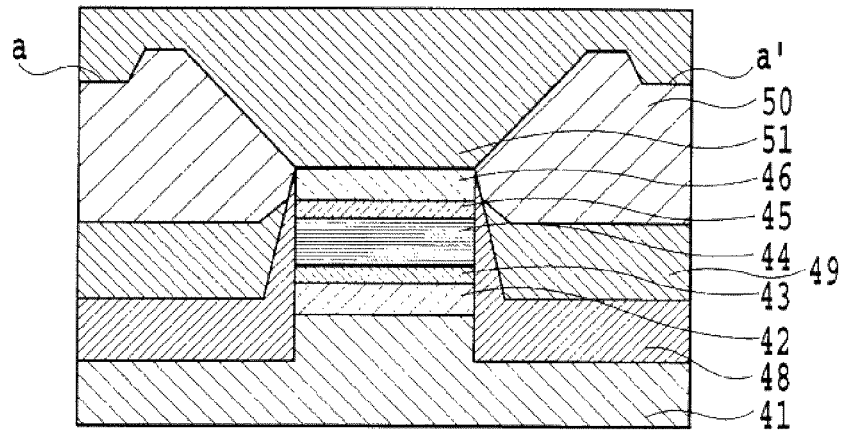
FIG. 5E is a cross sectional view showing a process for fabricating a semiconductor device according to Embodiment 3 of the present invention.

As shown in FIG. 5D, when the mask 47 made of $SiO_2$ was removed, a V-shaped-like groove was formed. In order to flatten the concavo-convex shape of this groove, as shown in FIG. 5E, an n-type InP over-cladding layer 51 having a layer thickness of 2 µm and having Se doping concentration of $6\times10^{18}$ $cm^{-3}$ was grown by utilizing the MOVPE.

Figure 5F:
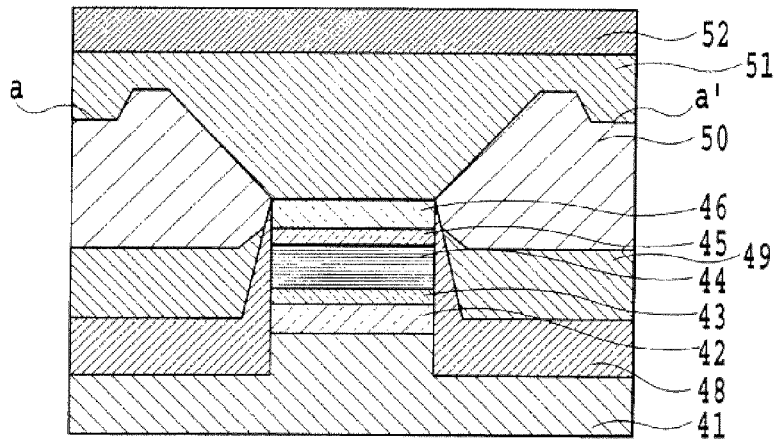
FIG. 5F is a cross sectional view showing a process for fabricating a semiconductor device according to Embodiment 3 of the present invention.

Thereafter, as shown in FIG. 5F, an n-type indium gallium arsenide phosphorus (InGaAsP) contact layer 52 having a layer thickness of 0.4 µm and containing Se as dopant was grown by utilizing the MOVPE. Each compound semiconductor other than that of the active layer has composition lattice-matching with the InP substrate unless especially notice is given.

Figure 5G:
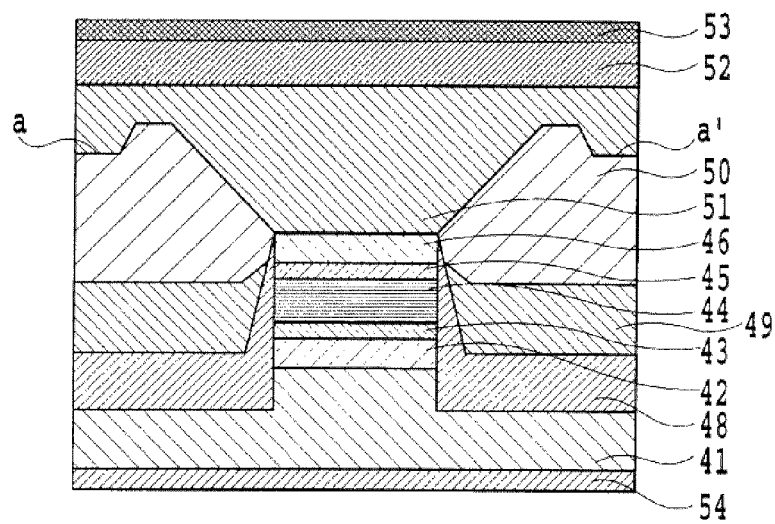
FIG. 5G is a cross sectional view showing a process for fabricating a semiconductor device according to Embodiment 3 of the present invention.

Next, as shown in FIG. 5G, an n-type electrode 53 was formed and a p-type electrode 54 was formed on the substrate side. Thereafter, the same mesa processing as that in Embodiment 1 was performed.

The optical small-signal response characteristics of a directly modulated semiconductor laser fabricated by using the method described above were measured. The 3-dB bandwidth of the semiconductor laser is about 15 GHz at the chip temperature of 25° C., and about 8 GHz at 95° C. The threshold current is about 8 mA at the chip temperature of 25° C., and about 35 mA at 95° C. The light output power efficiency is about 0.35 W/A at the chip temperature of 25° C., and about 0.15 W/A at 95° C.

This embodiment mode deals with the InGaAsP multiple quantum well (MQW) layer as the active layer of the laser. However, the present invention is effective in structures such as a bulk layer and a multiple quantum well layer in all systems, each having a substrate made of InP, such as an InP—InGaAsP—InGaAs system and an InAlAs—InGaAlAs—InGaAs system. In addition, even when the current-blocking buried structure adopts a layer structure other than those in the above-mentioned embodiments, the same effects are obtained. The semiconductor laser has been described in the above-mentioned embodiments. However, it is to be understood that the present invention is effective in not only other semiconductor devices and single devices such as an optical modulator, a semiconductor amplifier and a photodiode, but also integrated devices such as a device having an optical modulator integrated with a semiconductor laser, and a device having a semiconductor amplifier and an optical modulator integrated with each other.

As set forth hereinabove, this embodiment mode relates to the semiconductor optical device such as a semiconductor laser. Thus, even when the surface becomes the concavo-convex shape after the burying growth is performed, the over-cladding layer made of the crystal having the property for flattening the surface is used, thereby obtaining the contact layer not degrading the device characteristics.

INDUSTRIAL APPLICABILITY

The present invention is not limited to the semiconductor laser, and thus is effective in not only other semiconductor devices and single devices such as an optical modulator, a semiconductor amplifier and a photodiode, but also integrated devices such as a device having an optical modulator integrated with a semiconductor laser, and a device having a semiconductor amplifier and an optical modulator integrated with each other.

The invention claimed is:

1. A semiconductor optical device comprising
    a mesa-stripe stacked body including at least a p-type cladding layer, an active layer and an n-type cladding layer formed on a p-type InP substrate doped with Zn,
    a current-blocking layer buried in both sides of said stacked body, and
    an n-type over-cladding layer and an n-type contact layer disposed on said current-blocking layer and said stacked body,
    wherein said current-blocking layer is a single layer and a high-resistive layer made of an InP crystal doped with Ru, the upper surface of said current-blocking layer having a substantially level region disposed below the topmost height of the upper surface and above the height of the topmost layer of said stacked body, and a layer thickness of said current-blocking layer is between 3 and 5 μm;
    wherein said n-type over-cladding layer is made of an InP crystal doped with Se having a property for flattening a concavo-convex shape of upper surfaces of said current-blocking layer and said stacked body; and
    wherein doping concentration of Se is greater than or equal to $2 \times 10^{19}$ cm$^{-3}$ such that said n-type over-cladding layer is hardly grown in the substantially level region.

2. A method of fabricating a semiconductor optical device comprising the steps of:
    forming a stacked body including at least a p-type cladding layer, an active layer and an n-type cladding layer on a p-type InP substrate doped with Zn;
    processing said stacked body into a mesa stripe-like shape;
    burying a current-blocking layer which is a single layer and made of an InP crystal doped with Ru in both sides of said mesa stripe-shaped stacked body, wherein said current-blocking layer has an upper surface with a substantially level region disposed below the topmost height of the upper surface and above the height of the topmost layer of said stacked body, and a layer thickness of said current-blocking layer is between 3 and 5 μm;
    forming an over-cladding layer made of an InP crystal doped with Se to flatten a concavo-convex shape of upper surfaces of said current-blocking layer and said stacked body, wherein doping concentration of Se is greater than or equal to $2 \times 10^{19}$ cm$^{-3}$ such that said over-cladding layer is hardly grown in the substantially level region; and
    forming an n-type contact layer on said n-type over-cladding layer.

3. A method according to claim 2, wherein burying a current-blocking layer in both sides of said mesa stripe-shaped stacked body comprises growing the current-blocking layer directly on the p-type InP substrate.

4. A method according to claim 3, wherein forming an over-cladding layer comprises growing the over-cladding layer directly on the current-blocking layer.

* * * * *